(12) United States Patent
Saripalli et al.

(10) Patent No.: US 9,337,855 B2
(45) Date of Patent: May 10, 2016

(54) DIGITAL CALIBRATION OF TRANSMIT DIGITAL TO ANALOG CONVERTER FULL SCALE CURRENT

(71) Applicant: QUALCOMM Incorporated, San Diego, CA (US)

(72) Inventors: Ganesh Ramachandra Murthy Saripalli, San Diego, CA (US); Shahin Mehdizad Taleie, San Diego, CA (US); Michael Joseph McGowan, Mesa, AZ (US); Jenny Kuo, San Diego, CA (US); Dongwon Seo, San Diego, CA (US); Jalal Ahmad Elhusseini, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/532,264

(22) Filed: Nov. 4, 2014

(65) Prior Publication Data

US 2015/0349793 A1    Dec. 3, 2015

Related U.S. Application Data

(60) Provisional application No. 62/004,809, filed on May 29, 2014.

(51) Int. Cl.
*H03M 1/10* (2006.01)
*H03M 1/68* (2006.01)
*H03M 1/66* (2006.01)

(52) U.S. Cl.
CPC ............. *H03M 1/1009* (2013.01); *H03M 1/66* (2013.01); *H03M 1/68* (2013.01)

(58) Field of Classification Search
CPC ........ H03M 1/1009; H03M 1/68; H03M 1/66
USPC .......................................... 341/120, 144, 154
See application file for complete search history.

(56) References Cited

U.S. PATENT DOCUMENTS

| 5,955,980 | A | * | 9/1999 | Hanna | H03M 1/1057 341/120 |
| 6,166,670 | A | * | 12/2000 | O'Shaughnessy | G05F 3/262 341/136 |
| 6,724,336 | B2 | * | 4/2004 | Leung | H03M 1/0602 341/144 |
| 7,019,677 | B1 | * | 3/2006 | Soman | H03M 1/1047 341/144 |
| 7,924,199 | B2 | | 4/2011 | Tokumaru et al. | |
| 7,944,309 | B2 | | 5/2011 | Cao | |
| 7,990,300 | B2 | | 8/2011 | Takiguchi | |
| 8,089,380 | B2 | | 1/2012 | McLachlan et al. | |
| 8,179,295 | B2 | | 5/2012 | Ho et al. | |
| 8,493,251 | B2 | | 7/2013 | Riches | |
| 2011/0068765 | A1 | | 3/2011 | Segoria | |
| 2013/0226496 | A1 | | 8/2013 | Gudem et al. | |

* cited by examiner

*Primary Examiner* — Brian Young
(74) *Attorney, Agent, or Firm* — Loza & Loza LLP

(57) ABSTRACT

A method and apparatus for a method of calibrating a transmit digital to analog converter full-scale current. The method comprises generating a tuned reference current and then calibrating the tuned reference current to a selected value in order to produce a predetermined current value. The calibration further comprises dividing a reference voltage input over a resistor string. A band gap current is then generated using the divided reference voltage input. A tuned current output is then produced from a current steering digital to analog converter with the tuned output current stored in a register. The reference current for the transmit DAC is then generated based on the stored tuned output current.

15 Claims, 8 Drawing Sheets

DIGITAL CALIBRATION OF TRANSMIT DIGITAL TO ANALOG CONVERTER FULL SCALE CURRENT

This application claims priority to U.S. Provisional Pat. App. Ser. No. 62/004,809 entitled "Digital Calibration of Transmit Digital to Analog Converter Full Scale Current," filed May 29, 2014, assigned to the assignee of the present disclosure, the content of which is hereby incorporated by reference herein in their entirety.

FIELD

The present disclosure relates generally to digital calibration of a transmit digital to analog converter (DAC) full-scale current, and more particularly, to calibrate the reference current of the transmit DAC to provide a full-scale output current that is accurate within predefined limits.

BACKGROUND

Wireless communication devices have become smaller and more powerful as well as more capable. Increasingly users rely on wireless communication devices for mobile phone use as well as email and Internet access. At the same time, devices have become smaller in size. Devices such as cellular telephones, personal digital assistants (PDAs), laptop computers, and other similar devices provide reliable service with expanded coverage areas. Such devices may be referred to as mobile stations, stations, access terminals, user terminals, subscriber units, user equipments, and similar terms.

A wireless communication system may support communication for multiple wireless communication devices at the same time. In use, a wireless communication device may communicate with one or more base stations by transmissions on the uplink and downlink. Base stations may be referred to as access points, Node Bs, or other similar terms. The uplink or reverse link refers to the communication link from the wireless communication device to the base station, while the downlink or forward link refers to the communication from the base station to the wireless communication devices.

Wireless communication systems may be multiple access systems capable of supporting communication with multiple users by sharing the available system resources, such as bandwidth and transmit power. Examples of such multiple access systems include code division multiple access (CDMA) systems, time division multiple access (TDMA) systems, frequency division multiple access (FDMA) systems, wideband code division multiple access (WCDMA) systems, global system for mobile (GSM) communication systems, enhanced data rates for GSM evolution (EDGE) systems, and orthogonal frequency division multiple access (OFDMA) systems.

Mobile devices require an accurate current to correctly operate the device. In particular, an accurate current is needed for modem operation, which provides for calling and other advanced features. As chips become more complex, with more features combined within one die, such as the system on chip (SoC), both layout and current control become more challenging. An additional challenge is that more features must be routed using a limited number of pins, which makes device testing more difficult as many tests require the same output pins.

Mobile devices are also becoming increasingly popular, with many relying on them in place of conventional landlines. With increase use and popularity, it is important to test and produce mobile devices in the most expeditious and cost-effective manner. One area that currently limits automation is calibrating the reference current of the transmit digital to analog converter (DAC). At present, the reference current is calibrated using cumbersome analog and digital techniques to calibrate the current. These current techniques are designed to ensure a full-scale output current at a specified value, typically 2 mA. The transmit DAC output current full-scale value must be accurate within a specified value, and often requires very high precision of +/−1%. This accuracy may vary depending on the device and the operating system. A SoC may require this level of accuracy because the reference current generation may be done on the mobile station modem (MSM) side, (inside the transmit DAC) function, without any knowledge of information from the SoC system. Because the MSM may include process variations arising from variations from the incorporated resistors it is necessary to calibrate the full-scale output current on the transmit DAC. The variation in those resistors may be quite significant and require considerable individual adaptation in order to generate a reference current of the desired level of accuracy.

Previously, this variation was addressed by selectively blowing fuses to correct the on-chip resistor to match a known, external golden resistor. Once the resistor is tuned, it is then used as part of the band gap current generation circuit that generates a band gap reference current. A current mirror circuit would then be used with different multiplication ratios to multiply the input band gap current to the desired final reference current for the transmit DAC.

An alternate method also used previously involved blowing fuses to match a known, external golden resistor. Once the resistor is tuned, it is then used as part of a voltage circuit (V2I) to generate an accurate reference current. A current mirror circuit is then used with different multiplication ratios to multiply the reference current to the final desired reference current for the transmit DAC.

Each of the above methods has disadvantages. The methods require both hands-on digital and analog techniques that require individual adjustment on each chip. This increases time and cost. The methods may also require additional pins for testing and require routing traces to resistors that must be located nearby for greatest accuracy, which adversely affects the circuit board size and may also result in temperature hot spots on the circuit board. These methods also provide only limited gain adjustment and lack precision.

There is a need in the art for a method of digitally calibrating the reference current input of the transmit DAC to provide an accurate current within specified bounds.

SUMMARY

Embodiments contained in the disclosure provide a method of calibrating a transmit digital to analog converter full-scale current. The method comprises generating a tuned reference current and then calibrating the tuned reference current to a selected value in order to produce a predetermined current value. The calibration further comprises dividing a reference voltage input over a resistor string. A band gap current is then generated using the divided reference voltage input. A tuned current output is then produced from a current steering digital to analog converter with the tuned output current stored in a register. The reference current for the transmit DAC is then generated based on the stored tuned output current.

A further embodiment provides an apparatus for calibrating a transmit digital to analog converter full-scale current. The apparatus includes a device current driver amplifier and a current amplifier that is connected to the device current driver amplifier. The apparatus also includes a resistor string, a current steering digital to analog converter (DAC) that is connected to the current amplifier, and a current mirror.

A still further embodiment provides an apparatus for calibrating a transmit digital to analog converter full-scale current. The apparatus comprises: means for generating a tuned reference current and means for calibrating the tuned reference current to a selected value to produce a predetermined current value. The means for calibration further comprises: means for dividing a reference voltage input over a resistor string; means for generating a band gap current using the divided reference voltage input; means for producing a tuned current output from a current steering digital to analog converter; means for storing the tuned output from the tuned current steering digital to analog converter in a register; and means for generating the reference current for the transmit digital to analog converter based on the stored tuned output current.

A yet further embodiment provides a non-transitory computer readable media that includes program instructions, which when executed by a processor cause the processor to perform a method comprising the steps of: generating a tuned reference current and calibrating the tuned reference current to a selected value to produce a predetermined current value. The step of calibrating the tuned reference current to a selected value to produce a predetermined current value further comprises: dividing a reference voltage input over a resistor string; generating a band gap current using the divided reference voltage input; producing a tuned current output from a current steering digital to analog converter; storing the tuned output current from the tuned current steering digital to analog converter in a register; and generating the reference current for the transmit digital to analog converter based on the stored tuned output current.

DETAILED DESCRIPTION

Figure 1:
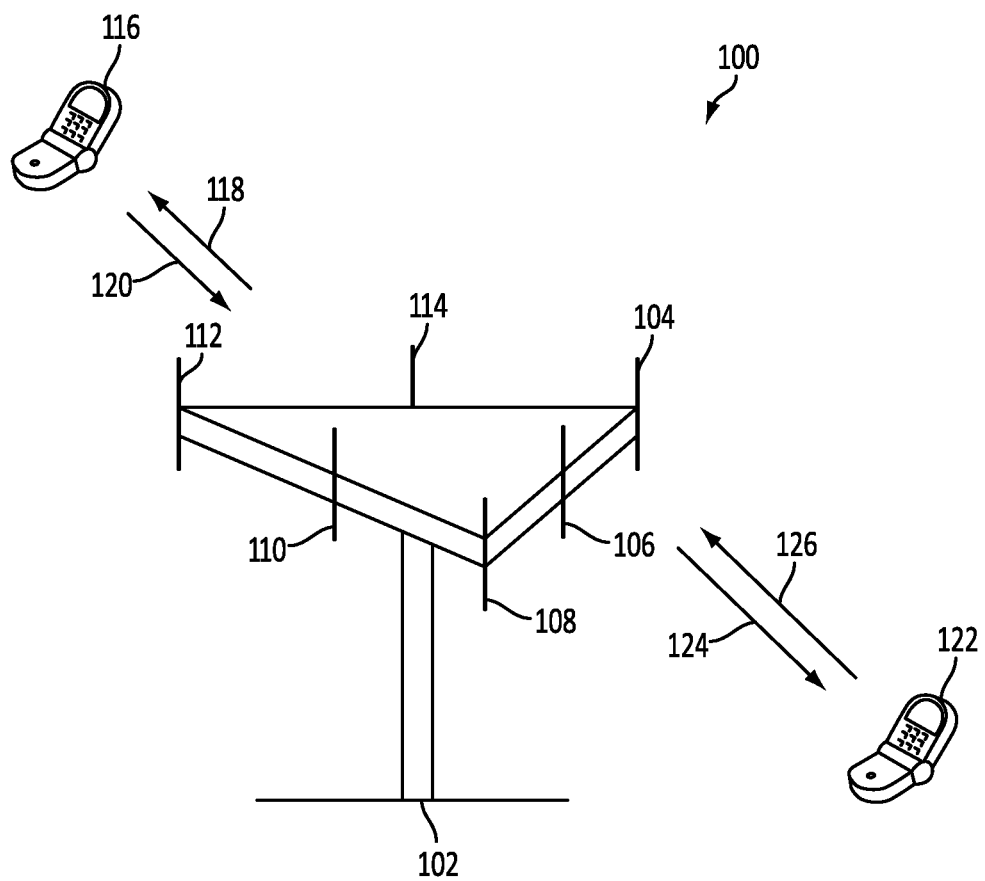
FIG. 1 illustrates a wireless multiple-access communication system, in accordance with certain embodiments of the disclosure.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

As used in this application, the terms "component," "module," "system," and the like are intended to refer to a computer-related entity, either hardware, firmware, a combination of hardware and software, software, or software in execution. For example, a component may be, but is not limited to being, a process running on a processor, an integrated circuit, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network, such as the Internet, with other systems by way of the signal).

Furthermore, various aspects are described herein in connection with an access terminal and/or an access point. An access terminal may refer to a device providing voice and/or data connectivity to a user. An access wireless terminal may be connected to a computing device such as a laptop computer or desktop computer, or it may be a self-contained device such as a cellular telephone. An access terminal can also be called a system, a subscriber unit, a subscriber station, mobile station, mobile, remote station, remote terminal, a wireless access point, wireless terminal, user terminal, user agent, user device, or user equipment. A wireless terminal may be a subscriber station, wireless device, cellular telephone, PCS telephone, cordless telephone, a Session Initiation Protocol (SIP) phone, a wireless local loop (WLL) station, a personal digital assistant (PDA), a handheld device having wireless connection capability, or other processing device connected to a wireless modem. An access point, otherwise referred to as a base station or base station controller (BSC), may refer to a device in an access network that communicates over the air-interface, through one or more sectors, with wireless terminals. The access point may act as a router between the wireless terminal and the rest of the access network, which may include an Internet Protocol (IP) network, by converting received air-interface frames to IP packets. The access point also coordinates management of attributes for the air interface.

Moreover, various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ), and integrated circuits such as read-only memories, programmable read-only memories, and electrically erasable programmable read-only memories.

Various aspects will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

Other aspects, as well as features and advantages of various aspects, of the present invention will become apparent to those of skill in the art through consideration of the ensuring description, the accompanying drawings and the appended claims.

FIG. 1 illustrates a multiple access wireless communication system 100 according to one aspect. An access point 102 (AP) includes multiple antenna groups, one including 104 and 106, another including 108 and 110, and an additional one including 112 and 114. In FIG. 1, only two antennas are shown for each antenna group, however, more or fewer antennas may be utilized for each antenna group. Access terminal 116 (AT) is in communication with antennas 112 and 114, where antennas 112 and 114 transmit information to access terminal 116 over downlink or forward link 118 and receive information from access terminal 116 over uplink or reverse link 120. Access terminal 122 is in communication with antennas 106 and 108, where antennas 106 and 108 transmit information to access terminal 122 over downlink or forward link 124, and receive information from access terminal 122 over uplink or reverse link 126. In a frequency division duplex (FDD) system, communication link 118, 120, 124, and 126 may use a different frequency for communication. For example, downlink or forward link 118 may use a different frequency than that used by uplink or reverse link 120.

Each group of antennas and/or the area in which they are designed to communicate is often referred to as a sector of the access point. In an aspect, antenna groups are each designed to communicate to access terminals in a sector of the areas covered by access point 102.

In communication over downlinks or forward links 118 and 124, the transmitting antennas of an access point utilize beamforming in order to improve the signal-to-noise ration (SNR) of downlinks or forward links for the different access terminals 116 and 122. Also, an access point using beamforming to transmit to access terminals scattered randomly through its coverage causes less interference to access terminals in neighboring cells than an access point transmitting through a single antenna to all its access terminals.

An access point may be a fixed station used for communicating with the terminals and may also be referred to as a Node B, an evolved Node B (eNB), or some other terminology. An access terminal may also be called a mobile station, user equipment (UE), a wireless communication device, terminal or some other terminology. For certain aspects, either the AP 102, or the access terminals 116, 122 may utilize the techniques described below to improve performance of the system.

Figure 2:
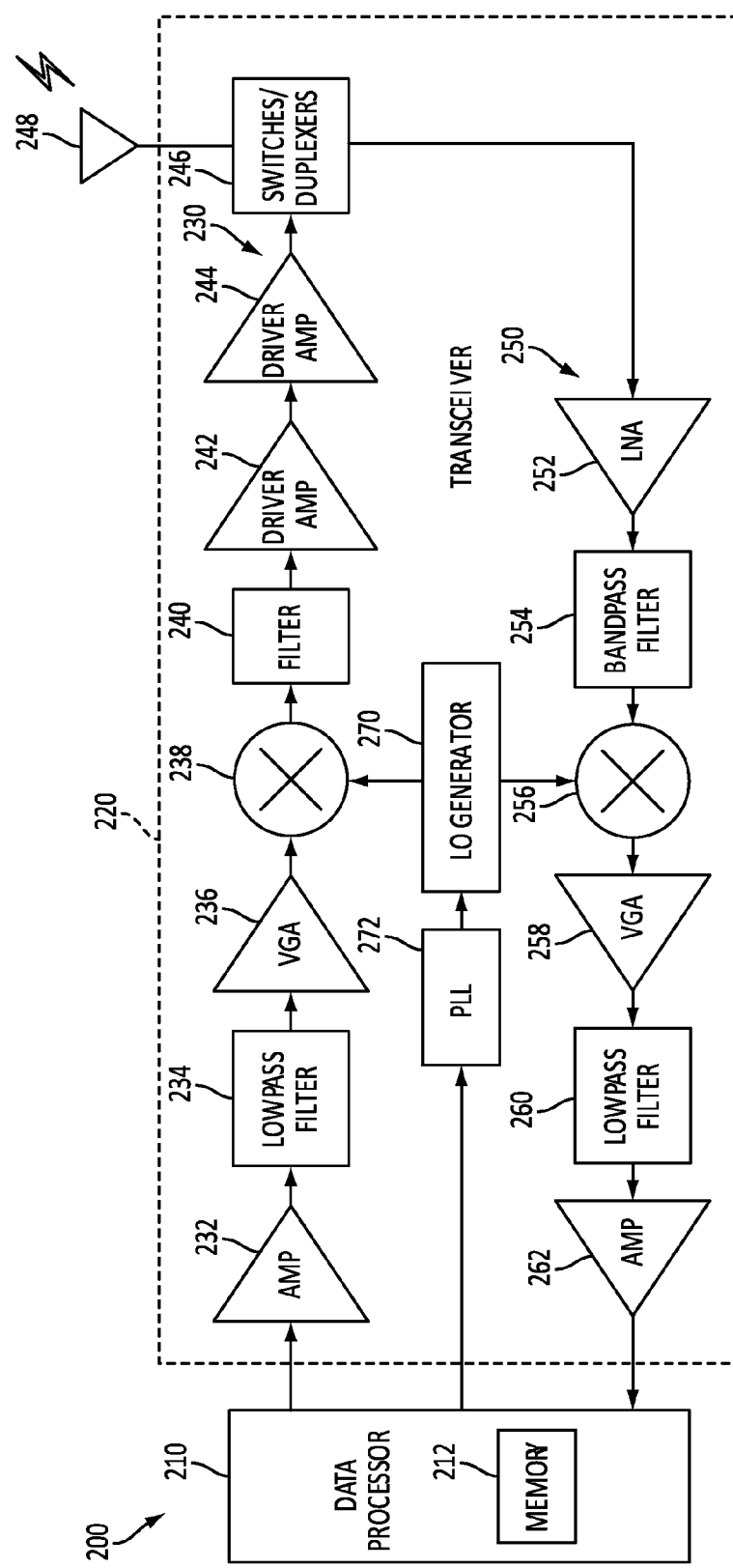
FIG. 2 is a block diagram of a wireless communication system in accordance with embodiments of the disclosure.

FIG. 2 shows a block diagram of an exemplary design of a wireless communication device 200. In this exemplary design, wireless device 200 includes a data processor 210 and a transceiver 220. Transceiver 220 includes a transmitter 230 and a receiver 250 that support bi-directional wireless communication. In general, wireless device 200 may include any number of transmitters and any number of receivers for any number of communication systems and any number of frequency bands.

In the transmit path, data processor 210 processes data to be transmitted and provides an analog output signal to transmitter 230. Within transmitter 230, the analog output signal is amplified by an amplifier (Amp) 232, filtered by a lowpass filter 234 to remove images caused by digital-to-analog conversion, amplified by a VGA 236, and upconverted from baseband to RF by a mixer 238. The upconverted signal is filtered by a filter 240, further amplified by a driver amplifier, 242 and a power amplifier 244, routed through switches/duplexers 246, and transmitted via an antenna 249.

In the receive path, antenna 248 receives signals from base stations and/or other transmitter stations and provides a received signal, which is routed through switches/duplexers 246 and provided to receiver 250. Within receiver 250, the received signal is amplified by an LNA 252, filtered by a bandpass filter 254, and downconverted from RF to baseband by a mixer 256. The downconverted signal is amplified by a VGA 258, filtered by a lowpass filter 260, and amplified by an amplifier 262 to obtain an analog input signal, which is provided to data processor 210.

FIG. 2 shows transmitter 230 and receiver 250 implementing a direct-conversion architecture, which frequency converts a signal between RF and baseband in one stage. Transmitter 230 and/or receiver 250 may also implement a superheterodyne architecture, which frequency converts a signal between RF and baseband in multiple stages. A local oscillator (LO) generator 270 generates and provides transmit and receive LO signals to mixers 238 and 256, respectively. A phase locked loop (PLL) 272 receives control information from data processor 210 and provides control signals to LO generator 270 to generate the transmit and receive LO signals at the proper frequencies.

FIG. 2 shows an exemplary transceiver design. In general, the conditioning of the signals in transmitter 230 and receiver 250 may be performed by one or more stages of amplifier, filter, mixer, etc. These circuits may be arranged differently from the configuration shown in FIG. 2. Some circuits in FIG. 2 may also be omitted. All or a portion of transceiver 220 may be implemented on one or more analog integrated circuits (ICs), RF ICs (RFICs), mixed-signal ICs, etc. For example, amplifier 232 through power amplifier 244 in transmitter 230 may also be implemented on an RFIC. Driver amplifier 242 and power amplifier 244 may also be implemented on another IC external to the RFIC.

Data processor 210 may perform various functions for wireless device 200, e.g., processing for transmitter and received data. Memory 212 may store program codes and data for data processor 210. Data processor 210 may be implemented on one or more application specific integrated circuits (ASICs) and/or other ICs.

Embodiments described herein address calibrating the reference current input of a transmit DAC using a combination of analog and digital techniques, so that the transmit DAC full-scale output current is at an accurate preselected level, such as 2 mA. The embodiments described herein provide very accurate current, and may be within ±0/5% for a 2 mA current. The methods also correct for a wide range of resistor variation, and may achieve ±64% range correction with minimal hardware. The range achieved may depend on the number of bits used. This reduces the amount of hardware needed. The methods provide more accurate full-scale output current and allow automation of the current reference for the final transmit DAC current.

Instead of tuning the resistor string or "ladder" to achieve a more accurate current, embodiments described herein use a current steering DAC to generate a tuned reference current. This tuned reference current is then calibrated to a selected value, such that the final transmit DAC full-scale current is the desired value. The programming range may be automatically resized according to the tuned value. A simple resistor is used along with a current steering DAC. This final output current is measured on input to a golden resistor.

A further advantage is that the techniques described are highly programmable because digital tuning of the tuned value is provided, with 0/1 dB steps in the DAC full-scale output. The techniques are implemented as a digital feature that automatically resizes the programming range according to the tuned value. In addition, because the DAC output pins are reused during the calibration, package pins are saved for other uses.

The method also is capable of a wide range of gain adjustment, which may be from +1.5 dB to −19.5 dB with 0.1 step sizes, with the range indicating how much resistor variation may be corrected. The gain range may be determined by distributing the gain adjustment in three places: 6 dB steps in the resistor ladder, 3 dB steps in the NMOS current mirror, and +1.5 dB steps in the IFS DAC. NEED DEFINITION OF IFS. This flexibility also results in a saving of area and power efficiency, when compared with more traditional approaches.

Figure 3:
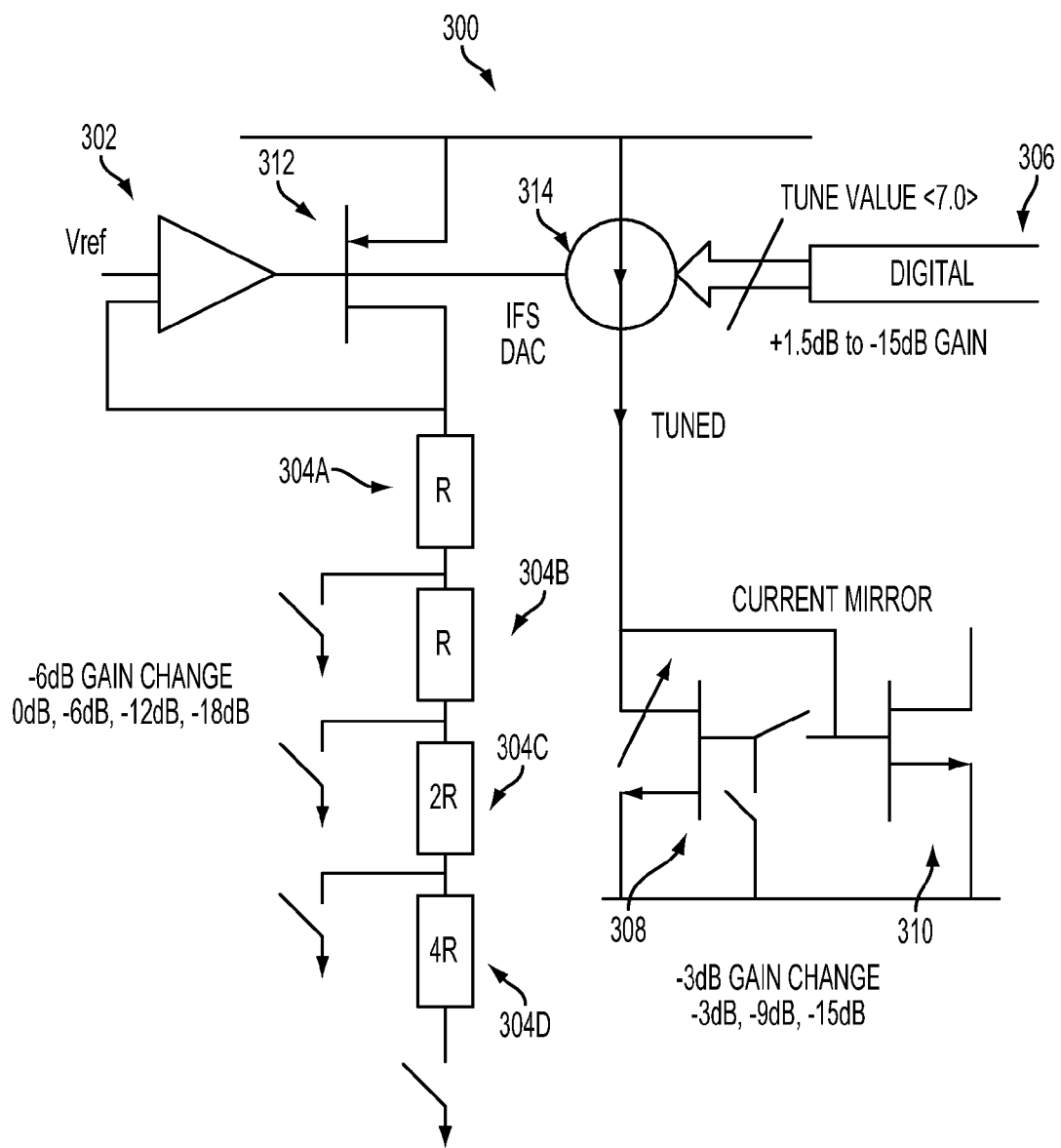
FIG. 3 illustrates an apparatus for digital calibration of transmit digital to analog converter 9DAC) full-scale current, according to embodiments of the disclosure.

FIG. 3 illustrates an embodiment of the apparatus for performing the method of digital calibration of transmit DAC converter full-scale current. The full-scale current calibrating system 300, includes a device current driver amplifier 302 connected to current amplifier 312. This current driver amplifier 302 is trying to apply a reference voltage to resistor string 304A-D, thus creating a current that is proportional to the resistor string. Resistor string 304 may move in 6 dB steps, however, depending on application, different steps may be selected. Current amplifier 312 is connected to IFS DAC 314. IFS DAC 314 is controlled by the digital logic 306. The IFS DAC 314 creates a replica of the current generated in the resistor ladder string 304 and this replica is controlled by digital code to produce a tuned current. Because the code is digital it may be changed to produce finer gain steps, and need only be changed by a few least significant bits (LSB) to accommodate this. Tuned current from IFS DAC 314 is input to current mirror 308, which incorporates transistor 310.

Band gap current is generated using the V2I circuit by driving the voltage reference (VREF) over the resistor string 304A-D. The reference current forms the unit currents inside the current steering (IFS)DAC 314 and is controlled by the V2I circuit composed of operational amplifier 302 and resistor string 304.

IFS DAC 314 takes eight bits of digital input, which represents the tuned value. This tuned value is then stored in a fuse register 306. The tuned current is then used by current mirror 308 to generate the reference current for the transmit DAC. The current mirror 308, which is an NMOS current mirror, achieves −3 dB steps at any gain setting. Resistor string 304A-D achieves −6 dB steps at any gain setting. The resistor values may be scaled to produce 6 dB step sizes, which are beyond the range of the IFS DAC 314. However, for different step sizes different resistor string values may be selected without departing from the scope of the method described herein. The IFS DAC 314 provides +1.5 dB to −1.5 dB gains at any gain setting selected. Temperature compensation for the V2I reference current is provided due to the finite TiN resistor temperature coefficient.

Figure 4:
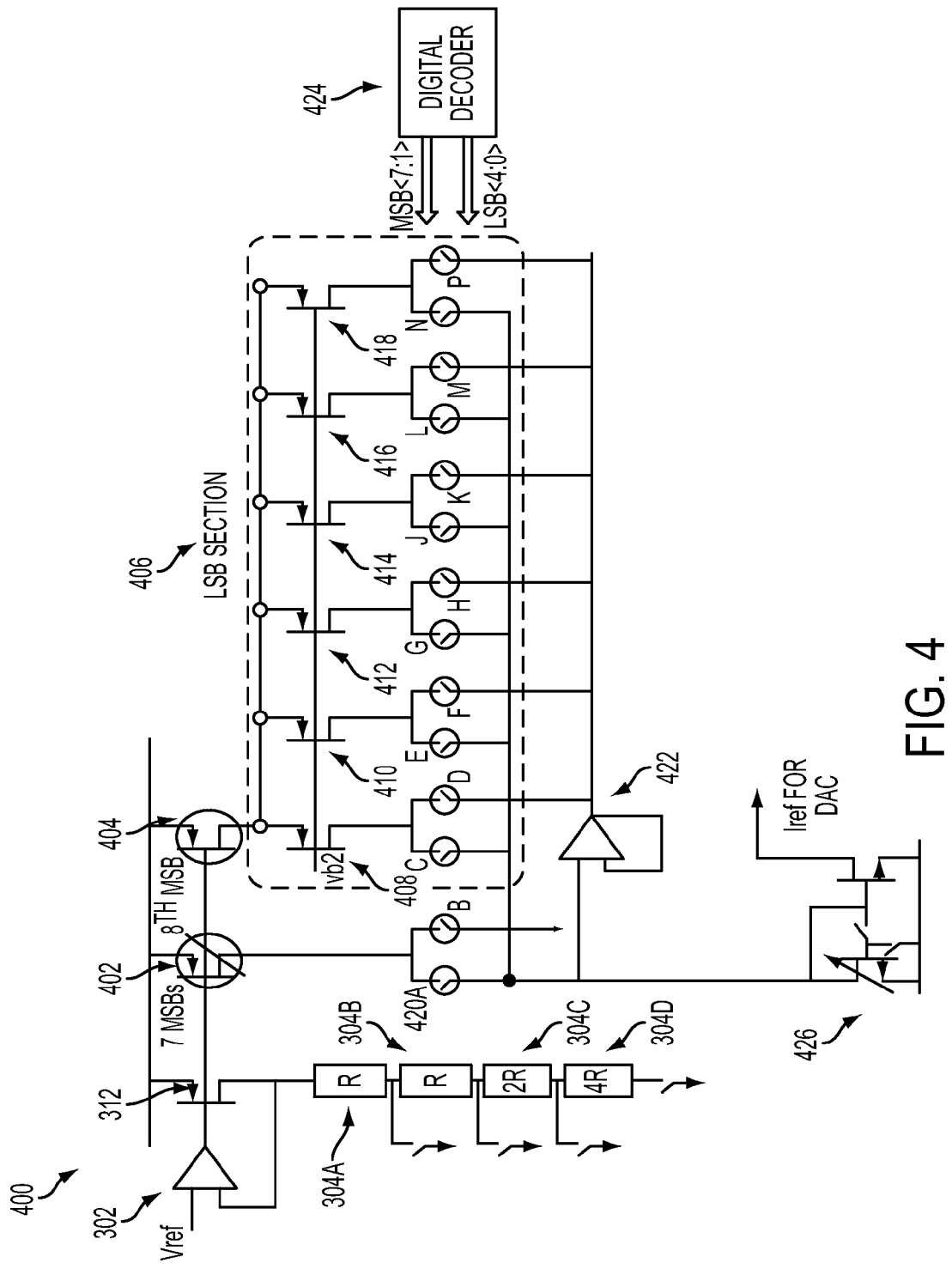
FIG. 4 is a block diagram of a digital encoding system with a digital encoder, according to an embodiment described herein.

FIG. 4 illustrates the digital encoding system with a digital decoder, according to an embodiment described herein. FIG. 4 also provides a detailed circuit implementation of the concept presented in FIG. 2. The circuit, 400, includes the device current amplifier 312 and resistor string 304A-D, which comprise the V2I circuit. Device current driver amplifier 302 is connected to transistor 312. Transistor 312 inputs to most significant bit (MSB) device 402 (devices 1-7) and 404 ($8^{th}$ device). MSB transistor 402 is connected to switches 420A and 420B. Switch 420A provides an input to current mirror 426. Switch 420B provides an input to operational amplifier 422. $8^{th}$ MSB transistor 404 provides inputs to transistors 408, 410, 412, 414, 416, and 418. Each of these transistors is in turn connected to two switches, respectively 420C and 420D, 420# and 420F, 420G, 420H, 420J, and 420K, 420L, and 420M and 420N and 420P. Digital decoder 424 provides 7:1 MSB input and least significant bit (LSB) (4:0) input to the switch series.

In operation, eight bits are used for tuning, with three MSB bits implemented as thermometer decoding, with the remaining five bits used in a binary fashion. The $8^{th}$ MSB is split using a current splitter with cascode devices. The +voltage side current is the output of the DAC representing the tuned current. The −voltage side current is directed to ground. The over the air (OTA) for the LSB is needed to maintain the differential non-linearity (DNL) error accuracy of the LSB splitter section.

Figure 5:
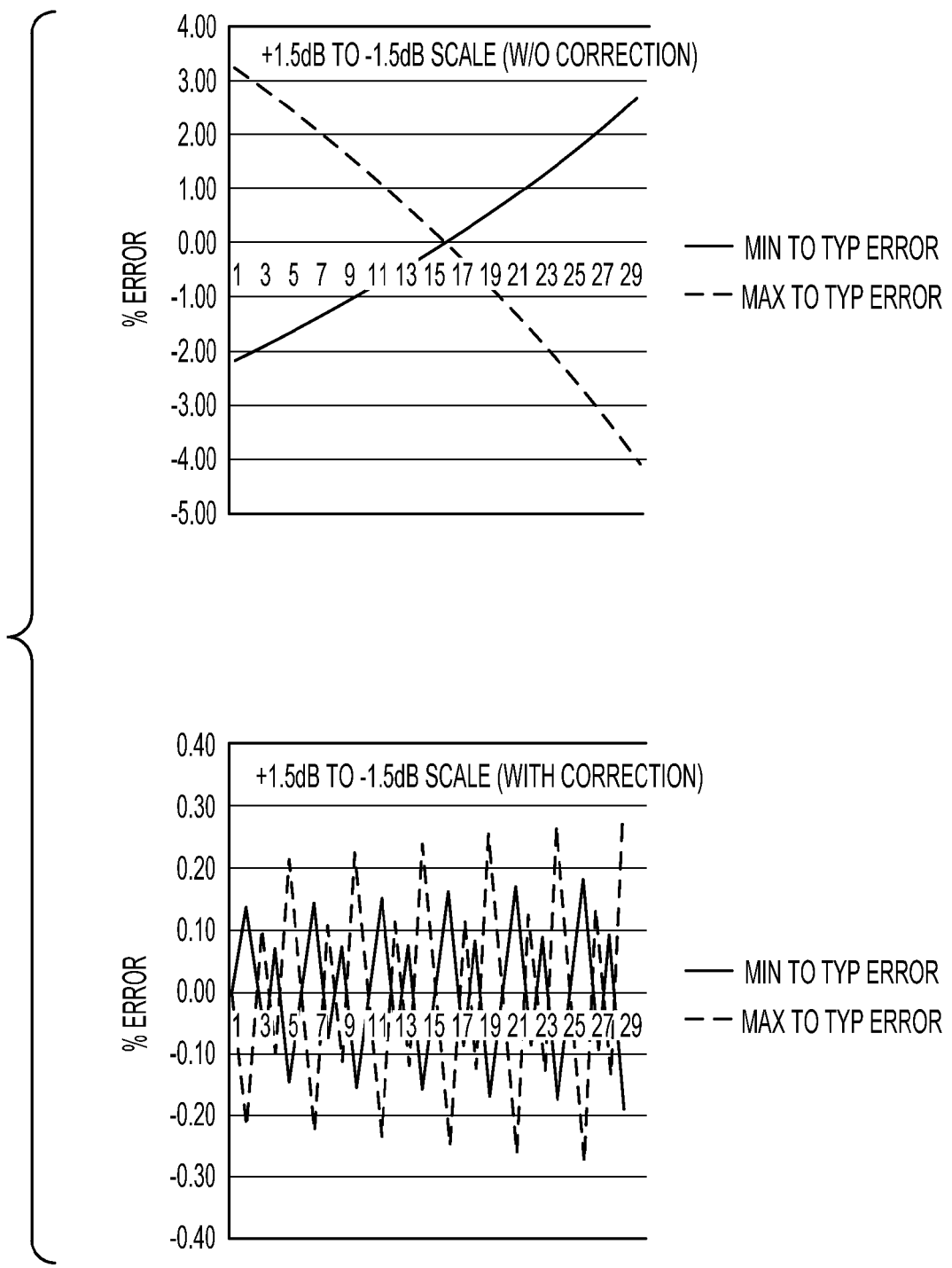
FIG. 5 illustrates simulation results of digital calibration of transmit DAC full-scale current according to embodiments described herein.

FIG. 5 shows the simulation results of digital calibration of transmit DAC full-scale current, in accordance with embodiments described herein. The left diagram illustrates the maximum and minimum type errors seen over a range of +1.5 dB to −1.5 dB without correction. In contrast, the right diagram shows the +1.5 dB to −1.5 dB scale with correction.

A further embodiment provides automatic digital correction for process variations. The unit current inside the IFS DAC may vary with resistor process variation. This arises because of the V2I reference current. As a result, the LSB size changes with each process corner. Changing the code by a determined number of LSBs causes the current to change in each process corner. However, it would be desirable to eliminate the process corner, and this may be done by digitally correcting the LSB size by scaling the digital input. When the digital input is scaled to account for the process corner, the gain steps of 1 dB, or other selected value, will hold through process variation corners of the resistor. The formula, implemented digitally is:

$$X = Xideal \times \frac{N + 72}{1024} \times 5$$

Figure 6:
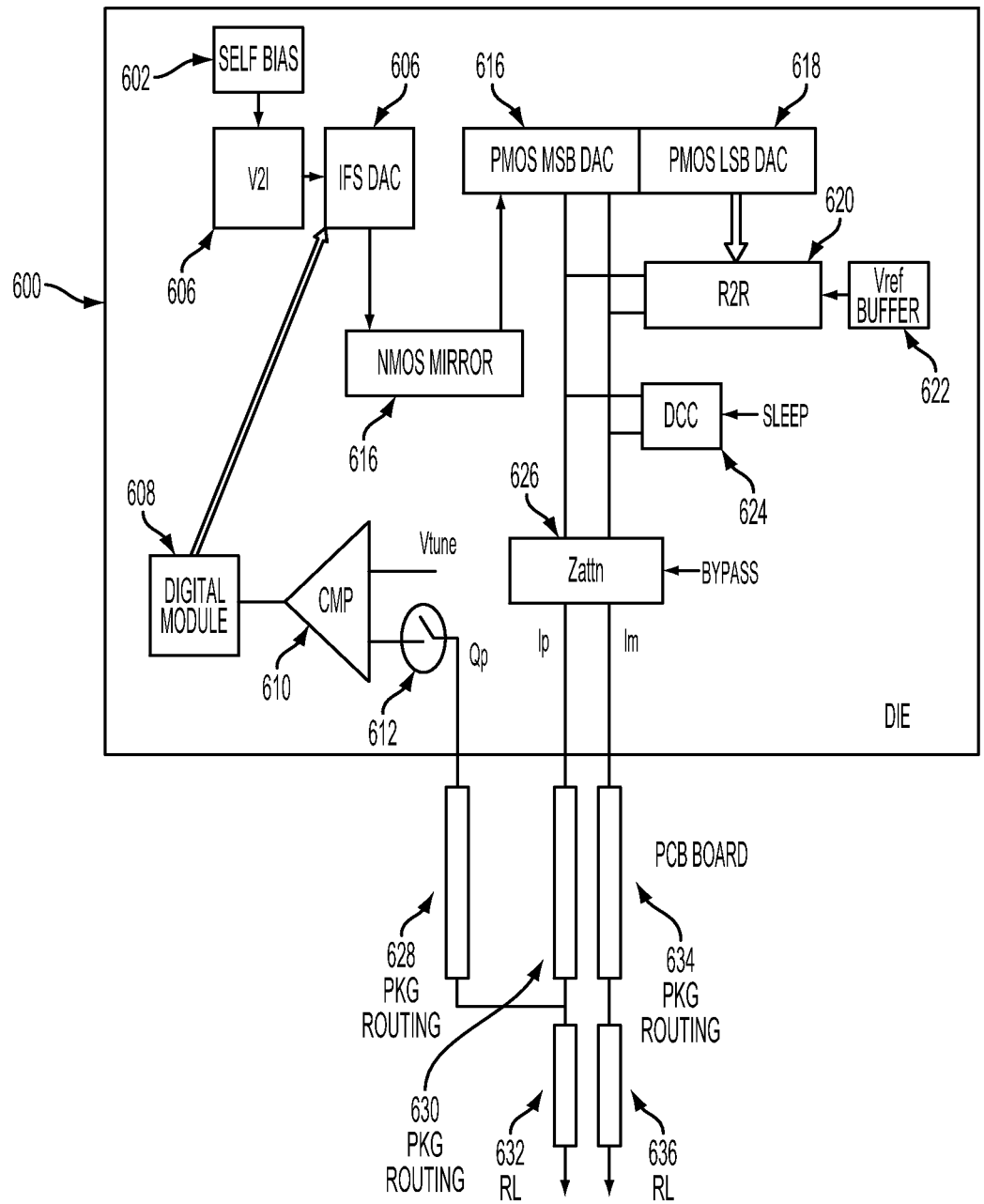
FIG. 6 depicts reuse of DAC output pins for calibration, according to an embodiment described herein.

FIG. 6 shows an embodiment that provides for reuse of the DAC output pins for calibration. The assembly, 600, includes self-bias circuit 602, which is connected to the V2I circuit 604. The VwI circuit 604 is connected to IFS DAC 606. The IFS DAC 606 receives input from the digital module 608 and outputs to NMOS current mirror 614. The digital module 608 is controlled by the comparator 610, which compares its two inputs: one is a predetermined reference voltage Vtune and the other is the sensed voltage on Qp node through the Qp switch 612. The Qp switch 612 receives its input from the printed circuit board (PCB) board routing, which is connected directly at the golden resistor 632. N-channel metal oxide semiconductor (NMOS) current mirror 614 provides input to P-channel metal oxide semiconductor (PMOS) MSB DAC 616, which is coupled with PMOS LSM DAC 618. PMOS LSB DAC 616 provides inputs to an attenuator, Z, 626, DCC 624, and resistor ladder R2R 620. The voltage reference buffer Vref 622 is also connected to R2R 620. R2R 620 and DCC 624 provide inputs to attenuator 626. Attenuator 626 provides two current outputs, ip and im to package routing 630 and the PCB 624, respectively. Package routing 632 is the golden resistor used in establishing the full-scale calibration current for the transmit DAC. Resistor 636 is connected to PCB 634.

FIG. 6 also illustrates how the DAC output pins may be reused for calibration. The calibration requires access to external golden resistor 632. The DAC outputs are used for the calibration, in contrast to current techniques, which require additional pins be available. To perform the calibration, the DAC is set at maximum code and all of the current flows out of the ip node. The Ip nodes is connected to golden resistor 632. The Qp node is then used to sense the voltage at the external resistor 632. The Q output is turned off during the calibration. After calibration the comparison between the actual and desired output current is made and any changes are implemented. This layout provides the benefit of avoiding incurring additional resistance from the package and PSB 634 trace routing and ensures an accurate sense of the external resistor value.

Figure 7:
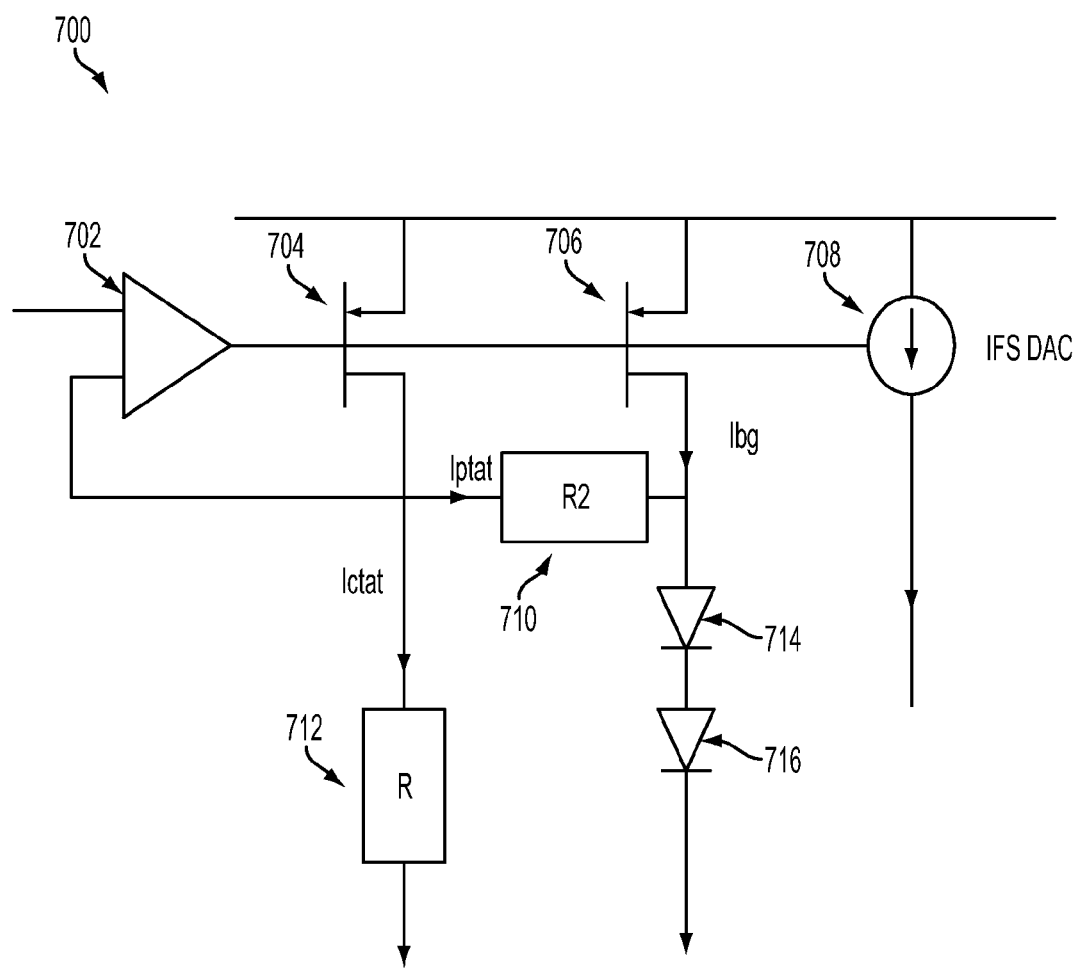
FIG. 7 shows temperature compensation for DAC reference current according to an embodiment.

FIG. 7 depicts a further embodiment that provides temperature compensation for the DAC reference current (Iref) due to the on-chip resistor having a high temperature coefficient. Resistors may have a negative temperature coefficient. As the temperature increases the resistance decreases and thus the current increases. This requires that an additional current be created that behaves similarly. This additional current is then subtracted out to create a stable reference current. Assembly 700 includes a V2I circuit comprised of amplifier 702, which provides input to transistor 704. Complementary to absolute temperature (CTAT) current iCTAT is created as a result of applying a band gap voltage input to resistor 712. A second output of amplifier 712 provides input to resistor R2, 710. Transistor 704 is connected in parallel with transistor 076. Transistor 706 is also connected to R2 710. The output of R2 710 is connected to diodes 714 and 716, which are in series. The IFS DAC 708 receives a replica of the current flowing in the transistor 704 and transistor 706. The on-chip resistor has a high negative temperature coefficient (−ve). The reference current generated from the V2I circuit will display a CTAT behavior because of that −ve temperature coefficient. In order to generate a band gap current, a proportional to absolute temperature (PTAT) current must be added to the CTAT current. A simple method is given by the formula: (Vbandgap−Vbe)=VPTAT. VPTAT applied on resistor 701 in FIG. 7 generates a compensating current to remove the temperature coefficient of the current generated by Vbandgap/ R1. Resistor R2 7-1 may be scaled appropriately to the temperature coefficient of the R1 resistor 512. Using the method and apparatus described herein provides a correction of 2-3% of the temperature coefficient of the resistor. The value of the correction naturally depends on the components selected and the design goals.

Figure 8:
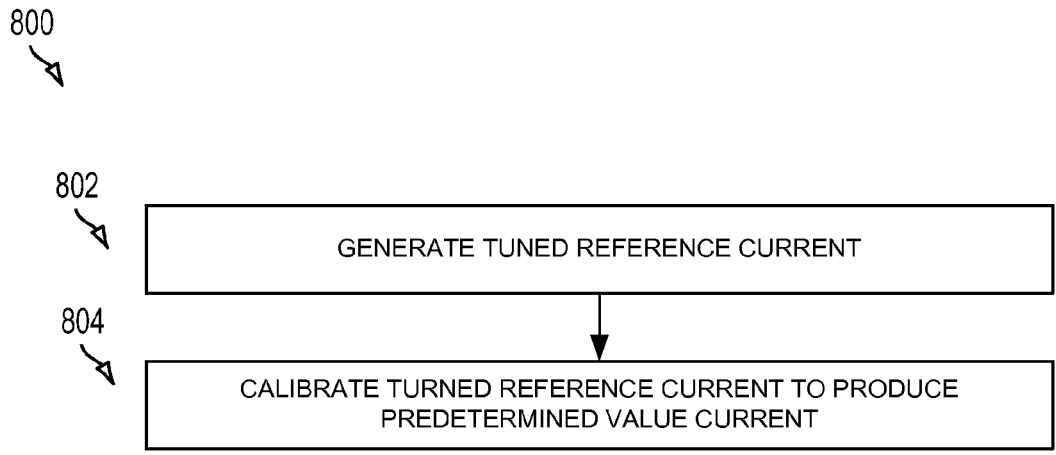
FIG. 8 is a flow diagram of a method of digital calibration of transmit DAC full-scale current according to an embodiment.

FIG. 8 is a flowchart of a method of calibrating a transmit DAC full-scale current. The method, 800 begins when a tuned reference current is generated in step 802. The tuned reference current is then calibrated to a value selected based on a pre-determined current value in step 804.

Figure 9:
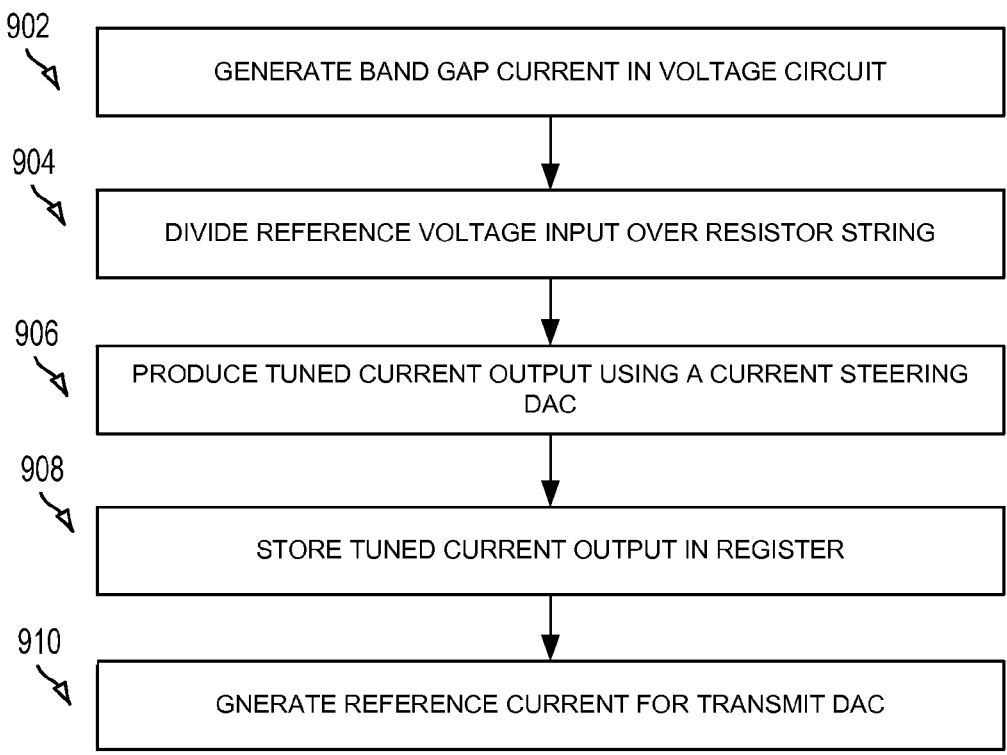
FIG. 9 is a flow diagram of a method of calibrating a transmit DAC full-scale current according to a further embodiment.

FIG. 9 is a flowchart of a further embodiment of a method of calibrating a transmit DAC full-scale current. The method, 900 begins with step 902. In step 902 a band gap current is generated in a voltage circuit. This band gap current is produced by dividing a reference voltage input over a resistor string in step 904. In step 906 a tuned current output is produced using a current steering DAC. This tuned current output is then stored in step 908. The reference current is then generated based on the tuned output current in step 910.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitter over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM EEPROM, CD-ROM or other optical disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A method of calibrating a transmit digital to analog converter full-scale current, comprising:
   generating a tuned reference current; and
   calibrating the tuned reference current to a selected value to produce a predetermined current value, wherein the calibrating the tuned reference current comprises:
   dividing a reference voltage input over a resistor string;
   generating a band gap current using the divided reference voltage input;
   producing a tuned current output from a current steering digital to analog converter;
   storing the tuned output current from the tuned current steering digital to analog converter in a register; and
   generating the reference current for the transmit digital to analog converter based on the stored tuned output current.

2. The method of claim 1, wherein a code representing a determined number of least significant bits scales a digital input.

3. The method of claim 1, wherein the calibration is performed by sensing a voltage at an external resistor on an output pin of the transmit digital to analog converter.

4. The method of claim 1, wherein the calibration generates a temperature compensating current.

5. The method of claim 1, wherein a distributed gain adjustment produces a range of gain programmability with gain adjustment steps of 0.1 dB.

6. The method of claim 1, wherein correction of process variations of an on-chip resistor is correlated to a number of bits used by the transmit digital to analog converter.

7. An apparatus for calibrating a transmit digital to analog converter full-scale current, comprising:
   means for generating a tuned reference current; and
   means for calibrating the tuned reference current to a selected value to produce a predetermined current value, wherein the means for calibrating the tuned reference current comprises:
   means for dividing a reference voltage input over a resistor string;
   means for generating a band gap current using the divided reference voltage input;
   means for producing a tuned current output from a current steering digital to analog converter;
   means for storing the tuned output current from the tuned current steering digital to analog converter in a register; and
   means for generating the reference current for the transmit digital to analog converter based on the stored tuned output current.

8. The apparatus of claim 7, wherein the means for calibrating performs the calibration by sensing a voltage at an external resistor on an output pin of the transmit digital to analog converter.

9. The apparatus of claim 7, wherein the means for calibrating generates a temperature compensating current.

10. A non-transitory computer readable media including program instructions which when executed by a processor cause the processor to perform a method of comprising the steps of:
    generating a tuned reference current; and
    calibrating the tuned reference current to a selected value to produce a predetermined current value, wherein the step of calibrating the tuned reference current to a selected value to produce a predetermined current value further comprises:
    dividing a reference voltage input over a resistor string;
    generating a band gap current using the divided reference voltage input;
    producing a tuned current output from a current steering digital to analog converter;
    storing the tuned output current from the tuned current steering digital to analog converter in a register; and
    generating the reference current for the transmit digital to analog converter based on the stored tuned output current.

11. The non-transitory computer readable media including the program instructions of claim 10, wherein a code representing a determined number of least significant bits scales a digital input.

12. The non-transitory computer readable media including the program instructions of claim 10, wherein the calibration is performed by sensing a voltage at an external resistor on an output pin of the transmit digital to analog converter.

13. The non-transitory computer readable media including the program instructions of claim 10, wherein the calibration generates a temperature compensating current.

14. The non-transitory computer readable media including the program instructions of claim 10, wherein a distributed gain adjustment produces a range of gain programmability with gain adjustment steps of 0.1 dB.

15. The non-transitory computer readable media including the program instructions of claim 10, wherein correction of process variations of an on-chip resistor is correlated to an number of bits used by the transmit digital to analog converter.

* * * * *